United States Patent
Chang

(10) Patent No.: US 9,360,587 B2
(45) Date of Patent: Jun. 7, 2016

(54) PROXIMITY SENSING METHOD

(71) Applicant: Sitronix Technology Corp., Zhubei (TW)

(72) Inventor: Hsien Jen Chang, New Taipei (TW)

(73) Assignee: Sensortek Technology Corp., Hsinchu County (TW)

( * ) Notice: Subject to any disclaimer, the term of this patent is extended or adjusted under 35 U.S.C. 154(b) by 241 days.

(21) Appl. No.: 13/946,191

(22) Filed: Jul. 19, 2013

(65) Prior Publication Data

US 2014/0021331 A1    Jan. 23, 2014

Related U.S. Application Data

(60) Provisional application No. 61/673,819, filed on Jul. 20, 2012.

(51) Int. Cl.
*G01C 21/24* (2006.01)
*G06M 7/00* (2006.01)
*G01V 8/10* (2006.01)
*H03K 17/94* (2006.01)

(52) U.S. Cl.
CPC ............... *G01V 8/10* (2013.01); *H03K 17/941* (2013.01); *H03K 2217/94026* (2013.01); *H03K 2217/94116* (2013.01)

(58) Field of Classification Search
CPC ............... G01J 1/4204; G04F 3/03547; G05B 2219/40544; G01S 17/026
USPC ............ 250/203.1, 203.2, 203.6, 221, 214 R, 250/214.1, 201.1, 559.29, 559.3, 559.31, 250/559.39, 214 AL; 356/3–5.15, 139.01; 235/414–416; 348/135, 142, 143, 162, 348/164, 166, 169; 345/156–181
See application file for complete search history.

(56) References Cited

U.S. PATENT DOCUMENTS

| | | | |
|---|---|---|---|
| 2008/0167832 A1* | 7/2008 | Soss | 702/104 |
| 2008/0224027 A1 | 9/2008 | Kunimori et al. | |
| 2012/0068958 A1 | 3/2012 | Chen | |
| 2012/0074322 A1 | 3/2012 | Skurnik | |
| 2014/0110583 A1* | 4/2014 | Wu | G01S 17/026 250/340 |

FOREIGN PATENT DOCUMENTS

| | | |
|---|---|---|
| CN | 102043509 A | 5/2011 |
| CN | 102446911 A | 5/2012 |
| EP | 2527958 A1 | 11/2012 |

(Continued)

OTHER PUBLICATIONS

Communication From the Chinese Patent Office Regarding a Counterpart Foreign Application Dated Sep. 16, 2015.

(Continued)

*Primary Examiner* — Pascal M Bui Pho
(74) *Attorney, Agent, or Firm* — Rosenberg, Klein & Lee

(57) ABSTRACT

The present invention relates to a proximity sensing method for proximity sensing unit in a mobile device. The proximity sensing method comprises steps of comparing a sensed value of the proximity sensing unit with a predetermined offset value or a first predetermined range to determine if the sensed value is smaller than the predetermined offset value or if the sensed value is within the first predetermined range; and providing an offset value for confirming if an object is near the mobile device according to the determination that if the sensed value is smaller than the predetermined offset value or within the first predetermined range.

10 Claims, 5 Drawing Sheets

(56) References Cited

FOREIGN PATENT DOCUMENTS

| | | |
|---|---|---|
| TW | 201133301 A | 10/2011 |
| TW | 201214213 A | 4/2012 |
| TW | 201215851 A | 4/2012 |

OTHER PUBLICATIONS

Communication From the Taiwan Patent Office Regarding a Counterpart Foreign Application Dated (Taiwan Year 103) Dec. 24, 2014.

* cited by examiner

PROXIMITY SENSING METHOD

FIELD OF THE INVENTION

The present invention generally relates to a proximity sensing method, and more particularly, certain embodiments of the invention relate to a proximity sensing method that applies in a mobile device.

BACKGROUND OF THE INVENTION

Proximity sensing is implemented through two optical elements, one is a LED and the other is a light sensor. The light sensor captures the light signal coming from the LED to identify the presence, the position and/or the number of the object later in a controller. Specifically, the LED could be an infrared LED emitting infrared signals and the light sensor could be an infrared light sensor correspondingly. If an object is close enough, a part of the infrared light from the infrared LED reflects on the object and turns to enter the infrared light sensor. Then, the infrared sensor may generate signals corresponding to the sensed infrared light. After some signal processing sequence(s), such as signal conditioning, AC/DC converting or other sequence(s), the micro-processor or micro-controller may utilize the processed digital signals for identification. Now, proximity sensing plays a crucial role in industry of automatic machining, precision machining, semi-conductor equipment and mobile devices.

Taking a mobile device with proximity sensing function for example, glass or other type of translucent material are utilized for covering and protecting a proximity sensing unit therein. However, this causes an undesirable consequence, the light sensor sensed a part of light emitted from the LED and reflected on the glass of other type of translucent material and incorrectly generates signals which may result in an incorrect determination of a close object. Moreover, the common tolerance for assembling the glass or other type of translucent material in the mobile device may effect the accuracy of the proximity sensing function.

For raising up the accuracy, the conventional solution is storing the value sensed by the proximity sensing unit therein to establish the basis for determination the presence of an object later on after the manufacturing process of a mobile device is done. For example, some parameters, such as threshold value and/or offset value, could be utilized for determination the presence of an object, and the aforesaid sensed value after manufacturing process could be taken as the offset value. When determining if an object is close, at least one threshold value could be utilized for comparing the resultant that the value sensed at the present moment minus the offset value with the threshold value.

However, actually, as the time runs and the environment outside the light sensor which may be influenced by a front cover sheet, paints, dirt changes, the decayed light sensor may be incorrectly determined an virtually non-existent object.

Therefore, a proximity sensing method to adapt to the changing of the environment or increase the accuracy is required.

SUMMARY OF THE INVENTION

One aspect of the present invention is to provide a proximity sensing method for a proximity sensing unit inside a mobile device to determine if an object is near the mobile device in the normal operation with an offset value which is capable to be varied along with the changing of the environment to increase the accuracy of the proximity sensing unit.

Another aspect of the present invention is to provide a solution to reset a predetermined offset value along with the changing of the environment through comparing the sensed value(s) with the predetermined offset value.

Another aspect of the present invention is to provide a solution to adjust the base at the right moment for determining if an object is near the mobile device through choosing one of the predetermined offset value and a dynamic offset value according to the determination that if the dynamic offset value is within the predetermined range.

Another aspect of the present invention is to provide a solution to fulfill the users different requirements with providing several modes for choose, such as resetting, maintaining the dynamic offset value, etc. according to the setting or determination regarding to a sensed value for the environmental light.

In one aspect of the invention, an embodiment of the invention is provided that a proximity sensing method, applied in a proximity sensing unit in a mobile device, comprising: comparing a sensed value of the proximity sensing unit with a predetermined offset value or a first predetermined range to determine if the sensed value is smaller than the predetermined offset value or if the sensed value is within the first predetermined range; and providing an offset value for confirming if an object is near the mobile device according to the determination that if the sensed value is smaller than the predetermined offset value or within the first predetermined range.

The mobile device for example could be but not limited to cell phone, PDA, tablet computer, etc.. The proximity sensing unit for example could be but not limited to integrated proximity sensor, preferably installed in the mobile device for sensing the proximity of a user and could be further specified as a MEMS proximity sensor in a cell phone.

The sensed value(s) in the present invention may correspond to any value sensed by the proximity sensing unit at any moment, comprising the present moment or the passed moment. The sensed value(s) may reflects any feature regarding to light which could be quantified, for example, light intensity, surface illumination, or the like. The aforesaid predetermined offset value could be obtained from the minimum value identified by a processing unit which is separated from the proximity sensing unit but inside the mobile device from the at least one sensed value sensed by the proximity sensing unit after the manufacturing process is done, empirical rules or other experimental method.

The proximity sensing unit could determine if a sensed value is smaller than a predetermined offset value or within a first predetermined range in different ways. In an example, the determination that if the sensed value is smaller than the predetermined offset value could be made according to a predetermined scenario, such as the fulfillment of a predetermined period or the occurrence of a specified scenario which may be a sensed value for the environmental light falling into a predetermined range, initiating a predetermined process comprising at least one of dialing, answering a call, accessing text message and utilizing application in the mobile device. Since the comparison between the sensed value and the predetermined offset value is carried out when determining the occurrence of the predetermined scenario, one can expect that the sensed value is an accurate measurement which is not influenced by the proximity of the user. In another example, the comparison between a sensed value stored in the mobile device and the first predetermined range to confirm if the sensed value is within the first predetermined range and then how to provide an offset value.

In the present invention, the steps for providing an offset value could be designed according to actual requirements. In one example, the sensed value could be taken for resetting the value of the predetermined offset value which is utilized as the offset value for confirming if an object is near when determining the sensed value is smaller than the predetermined offset value. In another example, the sensed value is taken as the offset value for confirming if an object is near when the sensed value is within the first predetermined range, otherwise, the predetermined offset value is taken.

In an example of the invention, for providing more flexible application, the stored value of the sensed value could be updated or maintained according to the setting of the user/manufacturer or the determination regarding to the sensed value for the environmental light. Similarly, the first predetermined range could be updated at the moment when the stored value of the sensed value is updated according to a variation trend of the sensed value contributed at different timing.

Additionally, in an example of the invention, the proximity sensing function could be combined with the environmental light sensing function. Then, during the normal operation of the proximity sensing unit, it can determine if a sensed value for the environmental light is within a second predetermined range. If yes, the maximum value of the sensed value for environmental light could be utilized for updating the predetermined offset value.

The proximity sensing method of the invention could operationally further comprise a mechanism for determining if an object is near. In one example, the proximity sensing unit could compare the resultant of a sensed value sensed at the present moment minus the offset value with a threshold value to determine if an object is near the mobile device. In another example, the proximity sensing unit could compare the resultant of a sensed value sensed at the present moment with the sum of the offset value and a threshold value to determine if an object is near the mobile device, and determine that an object is near the mobile device when the sensed value is greater than the sum.

Therefore, as illustrated above, the proximity sensing method in the present invention could timely update the offset value for determining if an object is near according to the actual environmental situation to sustain the accuracy of the proximity sensing function without affected by the normal operation of the mobile device.

BRIEF DESCRIPTION OF THE DRAWINGS

Various objects and advantages of the present invention will be more readily understood from the following detailed description when read in conjunction with the appended drawing, in which.

DESCRIPTION OF EMBODIMENTS OF THE INVENTION

Figure 1:
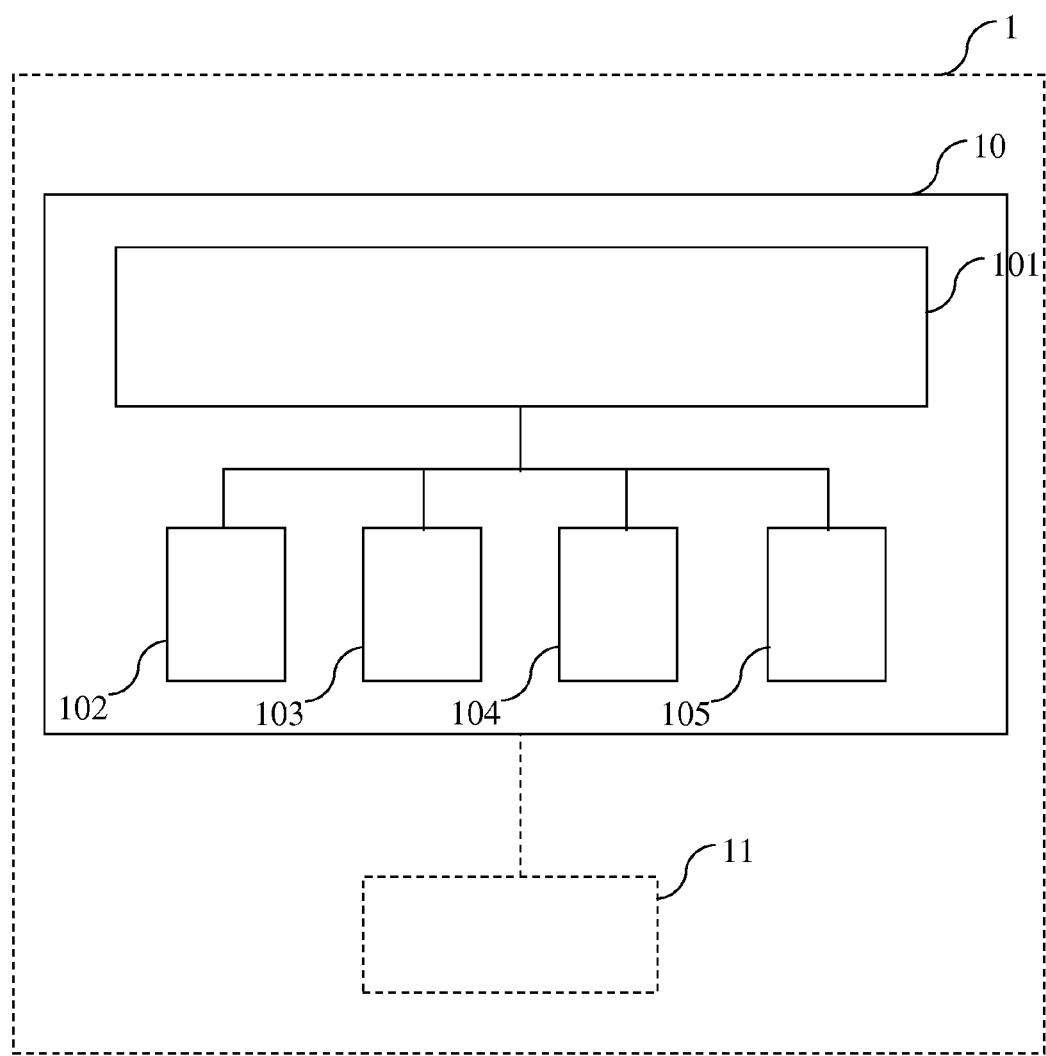
FIG. 1 shows a functional block of a mobile device according to an embodiment of the invention.

Please refer to FIG. 1 which shows a functional block of a mobile device according to an embodiment of the invention. The mobile device 1 for example could be but not limited to a cell phone, PDA, tablet computer, etc. Here, some elements, such as shell, human-machine interface comprising keys, touch panel, etc., shielding glass or other structures that could be installed, assembled, positioned or comprised in a mobile device as desired are not shown in the mobile device 1 of FIG. 1. The mobile device 1 comprises a proximity sensing unit 10 and a processing unit 11 separated from the proximity sensing unit 10 and connected with the proximity sensing unit 10. The proximity sensing unit 10 comprises a processing element 101, a light emitting element 102, a first light sensing element 103, a second light sensing element 104 and a storage element 105.

The processing element 101 is connected with the light emitting element 102, first light sensing element 103, second light sensing element 104 and storage element 105 to control the operation of these elements connected thereon. Preferably, the light emitting element 102 and the first light sensing element 103 are positioned beside each other. The first light sensing element 103 may sense a measureable feature of the light, such as light intensity, illumination, and the like, coming from the light emitting element 102, reflecting on an object and then going back to the first light sensing element 103 when the object is close to the light emitting element 102. The first light sensing element 103 then outputs signals corresponding to the measured value of the light to the processing element 101 for determining the existence of a near object.

In the present embodiment, the second light sensing element 104 is additionally provided for sensing a measureable feature of the light, such as light intensity, illumination, and the like, coming from the environment; however, it is possible to omit second light sensing element in the mobile device of some embodiment(s). Similarly, the second light sensing element 104 senses the light illumination of the environmental light at different timings to transmit corresponding signals to the processing element 101 for determining the current status of the environmental light.

The storage element 105 is for storing value(s) of parameters, sensed value(s), or the like which may be utilized by the processing element 101. Preferably, the storage element 105 may be a register, memory or the like.

Figure 2:
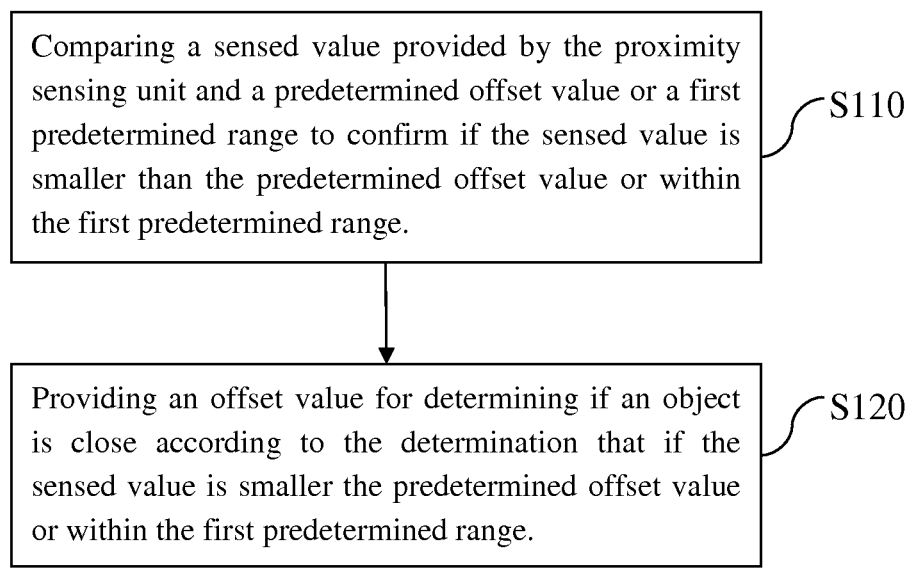
FIG. 2 shows a flow chart of a proximity sensing method according to an embodiment of the invention.

The processing element 101 performs a proximity sensing method of the invention. Please refer to FIG. 2 which shows a flow chart of a proximity sensing method according to an embodiment of the invention.

At first, the processing element 101 compares a sensed value provided by the proximity sensing unit 10 and a predetermined offset value or a first predetermined range to confirm if the sensed value is smaller than the predetermined offset value or within the first predetermined range (Step S110). In the present embodiment, the predetermined offset value or first predetermined range could be set by the manufacturer. For example, the predetermined offset value could be set as the minimum value identified by the processing unit 11 among several sensed values sequentially sensed by the first light sensing element 103 when the manufacturing process was done, therefore, the predetermined offset value reflected the offset value which is influenced by the status at that time. By comparing the sensed value sensed at the present moment with the predetermined offset value, the difference between the actual offset value at the present moment and the predetermined offset value which may be set when the manufacturing process was done or at other possible timing is identified to see if the difference exceed a tolerance which may be defined through the first predetermined range.

Then, providing an offset value for determining if an object is close according to the determination that if the sensed value is smaller the predetermined offset value or within the first predetermined range (Step S120). As mentioned above, after Step S110, if it is confirmed that the actual offset value at the current moment has no difference with predetermined offset value which may be set when the manufacturing process was done or at other possible timing or the difference still falls within the tolerance, the original predetermined offset value is provided as the offset value for determining if an object is close; in other cases, such as the difference existing between the actual offset value at the current moment and the predetermined offset value, the aforesaid difference exceeding the tolerance, etc., the offset value for determining if an object is close should be updated.

Figure 3:
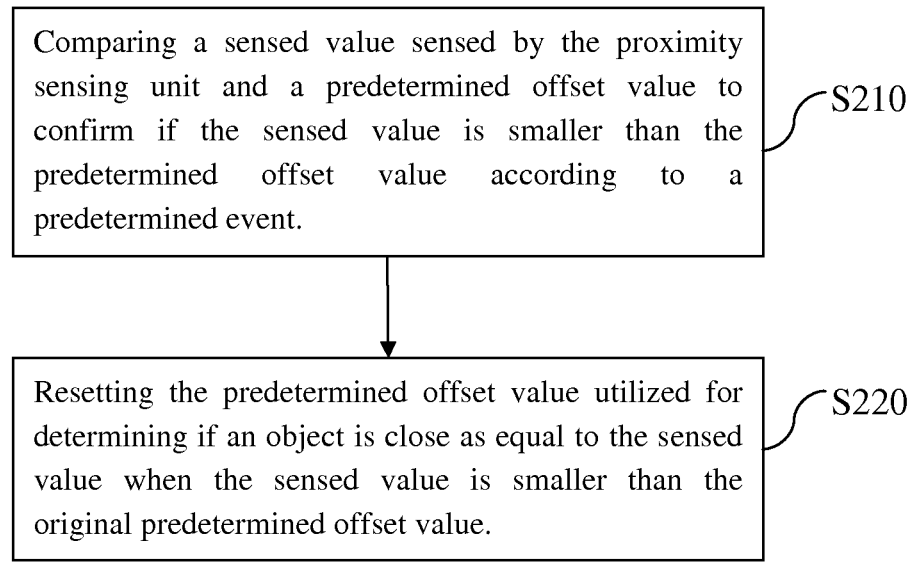
FIG. 3 shows a flow chart of a proximity sensing method according to an embodiment of the invention.

Please refer to FIG. 3 which shows a flow chart of a proximity sensing method according to another embodiment of the invention. In the present embodiment, the proximity sensing method comprises a step of comparing a sensed value sensed by the proximity sensing unit and a predetermined offset value to confirm if the sensed value is smaller than the predetermined offset value according to a predetermined event (Step S210) and a step of resetting the predetermined offset value utilized for determining if an object is close as equal to the sensed value when the sensed value is smaller than the original predetermined offset value (Step S220). For example or the sensed value may be but not limited to the value sensed by the proximity sensing unit 10 at the present timing, the corresponding signal transmitted from the first light sensing element 103 to the processing element 101. Therefore, when the value sensed at the present moment is smaller than the value sensed before, such as sensed when the manufacturing process was done, the stored predetermined offset value is replaced by the value sensed at the present moment, i.e. the sensed value, and then the updated predetermined offset value is taken as the offset value for determining if an object is close.

Please noted that the aforesaid predetermined event comprises either the fulfillment of a predetermined period or the occurrence of a specified scenario which preferably may be the scenario during which it is expected that the head, hand or any part of the user does not get close to the mobile device. For example, the specified scenario may comprise a sensed value for the environmental light falling into a predetermined range, initiating a predetermined process comprises at least one of dialing, answering a call, accessing text message and utilizing application in the mobile device, etc. Thus, it is more likely that the sensed value accurately reflects the measurement without any object covering the mobile device and of course not influenced by the proximity of the user when the occurrence of the predetermined event is identified.

Figure 4:
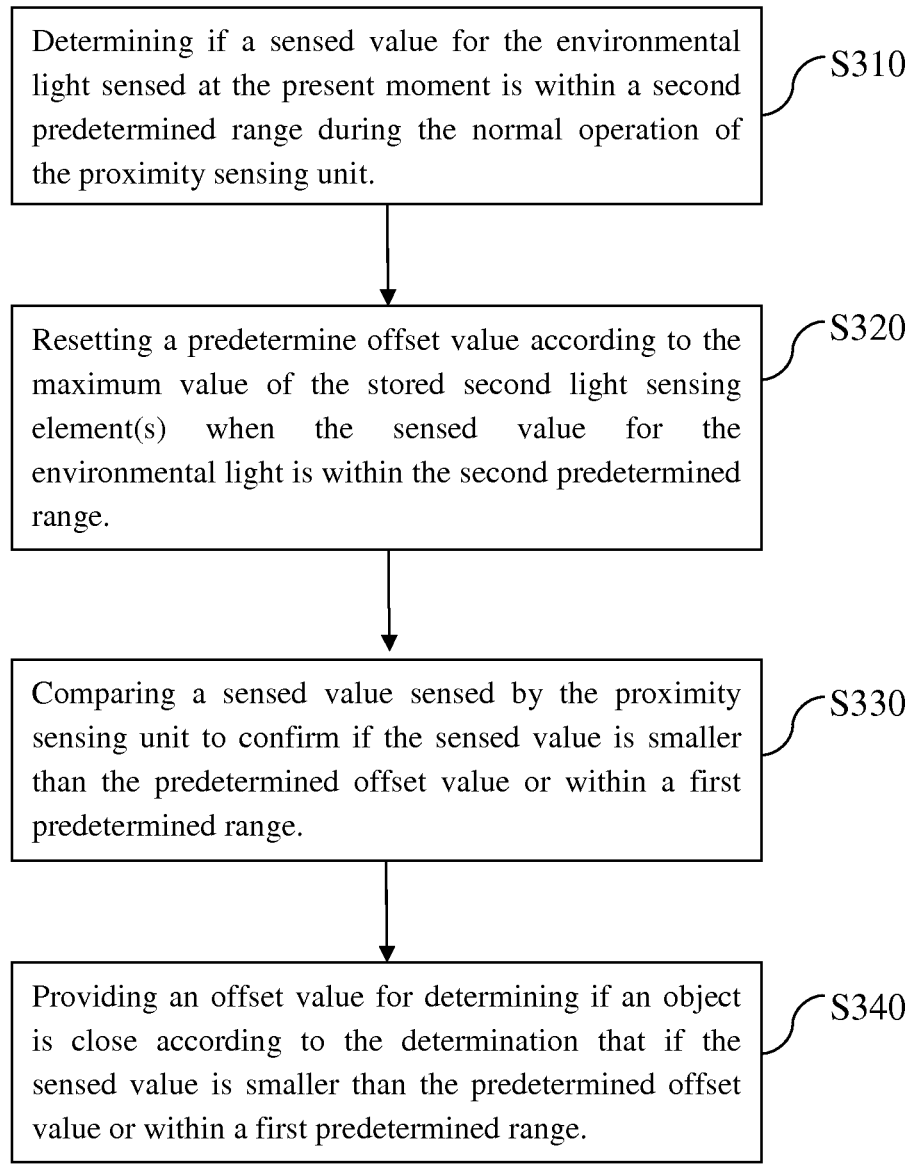
FIG. 4 shows a flow chart of a proximity sensing method according to an embodiment of the invention.

Please refer to FIG. 4 which shows a flow chart of a proximity sensing method according to another embodiment of the invention as well as FIG. 1. The proximity sensing unit 10 comprising the second light sensing element 104 may determine if a sensed value for the environmental light sensed at the present moment is within a second predetermined range during the normal operation of the proximity sensing unit 10 (Step S310). The second predetermined range may be set to margin the luminance value such that falling within the second predetermined range is sufficient to represent that the proximity sensing unit 10 is not shielded by any object. When the sensed value for the environmental light is within the second predetermined range, a predetermine offset value is reset according to the maximum value of the stored second light sensing element(s) (Step S320). Then, the predetermined offset value can be updated along with the variation of the environmental light. Later, similarly to FIG. 2, Step S330 and then Step S340 are performed. Step S330 is comparing a sensed value sensed by the proximity sensing unit to confirm if the sensed value is smaller than the predetermined offset value or within a first predetermined range. Step S340 is providing an offset value for determining if an object is close according to the determination that if the sensed value is smaller than the predetermined offset value or within a first predetermined range. Please refer to the paragraphs associated to FIG. 2 for the details of these two steps which are not repeated here.

Figure 5:
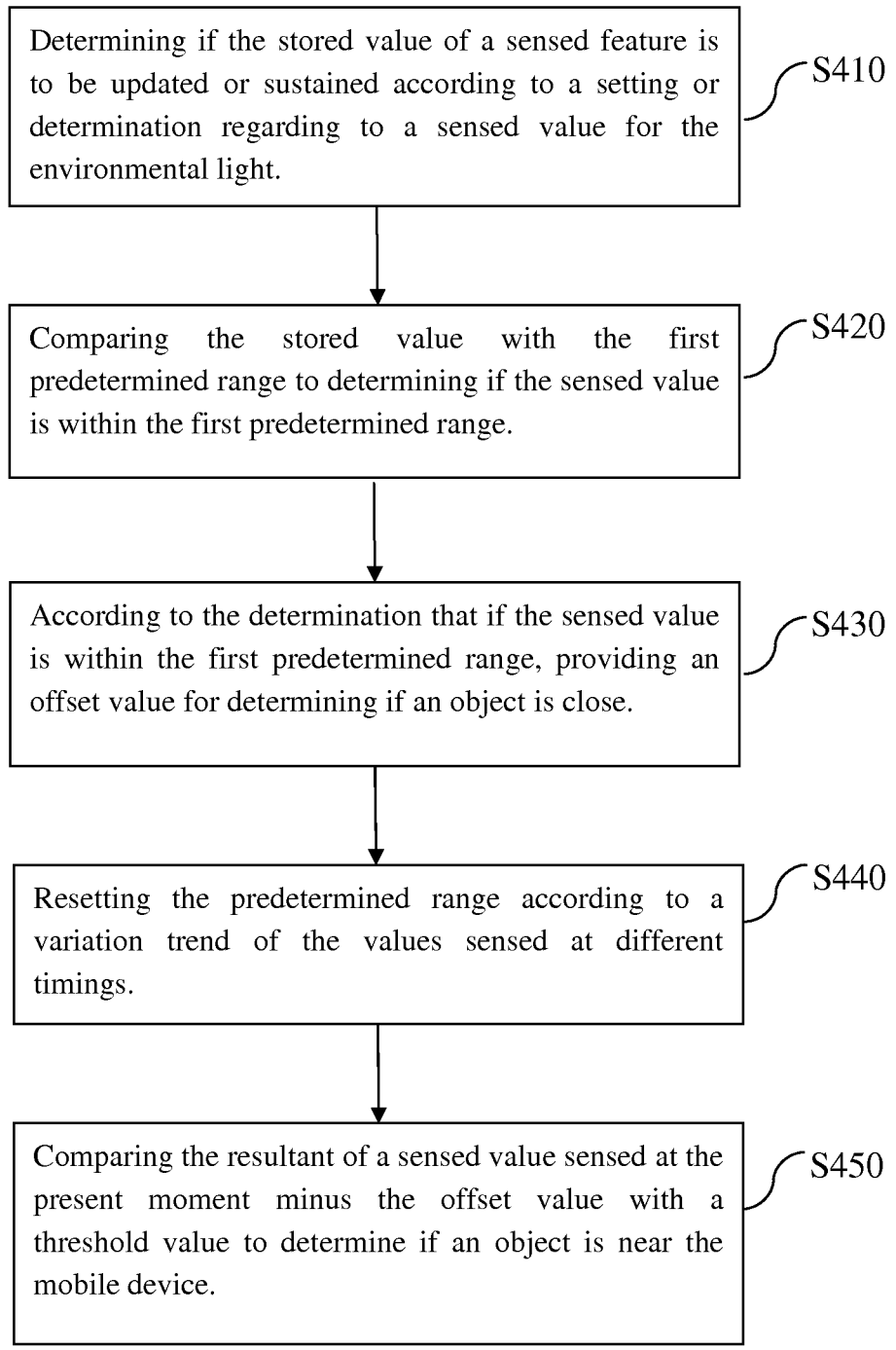
FIG. 5 shows a flow chart of a proximity sensing method according to an embodiment of the invention.

Please refer to FIG. 5 which shows a flow chart of a proximity sensing method according to another embodiment of the invention as well as FIG. 1. Please noted that the second light sensing element 104 is not necessary to the present embodiment. At the first step of the proximity sensing method, the stored value of a sensed feature is determined to be updated or sustained according to a setting or determination regarding to a sensed value for the environmental light (Step S410). Taking the structure shown in FIG. 1 for example, the values of the sensed value, first predetermined range and predetermine offset value may be stored in the storage unit 105, and these values may be updated or sustained according to a setting or determination regarding to a sensed value for the environmental light.

Here, it is assumed that the stored value for the sensed value is sensed at the past moment during which the mobile device is under normal operation. When the stored value is going to be updated due to the setting or determination as mentioned above, the stored value is compared with the first predetermined range to determining if the sensed value is within the first predetermined range (Step S420). The first predetermined range represents the tolerance of the deviation of the actual offset. Then, according to the determination that if the sensed value is within the first predetermined range, providing an offset value for determining if an object is close (Step S430). When the sensed value is within the first predetermined range, taking the sensed value as the offset value for above-mentioned determination; otherwise, taking the predetermined offset value as the offset value for above-mentioned determination. At the mean time or following Step S430, a step of resetting the predetermined range according to a variation trend of the values sensed at different timings (Step S440) may be performed. Then, the provided offset value is taken for determining if an object is close. For example, this can be carried out by comparing the resultant of a sensed value sensed at the present moment minus the offset value with a threshold value to determine if an object is near the mobile device (Step S450). The threshold value may be stored in the storage unit 105 as well.

Therefore, as illustrated above, the proximity sensing method in the present invention could timely update the offset value for determining if an object is near according to the actual environmental situation to sustain the accuracy of the proximity sensing function without affected by the normal operation of the mobile device.

It is to be understood that these embodiments are not meant as limitations of the invention but merely exemplary descriptions of the invention with regard to certain specific embodiments. Indeed, different adaptations may be apparent to those skilled in the art without departing from the scope of the annexed claims. For instance, it is possible to add bus buffers on a specific data bus if it is necessary. Moreover, it is still possible to have a plurality of bus buffers cascaded in series.

What is claimed is:

1. A proximity sensing method applied in a proximity sensing unit in a mobile device, the method comprising:

comparing a sensed value of the proximity sensing unit with a predetermined offset value or a first predetermined range to determine if the sensed value is smaller than the predetermined offset value or if the sensed value is within the first predetermined range;

comparing the sensed value stored in the mobile device with a predetermined value; and providing an offset value for confirming if an object is near the mobile device according to the determination that if the sensed value is smaller than the predetermined offset value or within the first predetermined range;

wherein when the sensed value is within the first predetermined range, choosing the sensed value as the offset value for confirming if the object is near the mobile device; and otherwise, choosing the predetermined offset value as the offset value for confirming if the object is near the mobile device.

2. The proximity sensing method according to claim 1, wherein the step of providing an offset value further comprises:

when the sensed value is smaller than the predetermined value, the predetermined offset value is reset as the same as the sensed value, and then the reset predetermined value is taken as the offset value for confirming if an object is near the mobile device.

3. The proximity sensing method according to claim 2, wherein the step of comparing a sensed value of the proximity sensing unit with a predetermined offset value or a first predetermined range further comprises:

according to a predetermined event comprising either the fulfillment of a predetermined period or the occurrence of a specified scenario, comparing the sensed value of the proximity sensing unit with the predetermined offset value to determine if the sensed value is smaller than the predetermined offset value.

4. The proximity sensing method according to claim 3, wherein the specified scenario comprises:

a sensed value for the environmental light falling into a predetermined range, initiating a predetermined process comprises at least one of dialing, answering a call, accessing text message and utilizing application in the mobile device.

5. The proximity sensing method according to claim 1, further comprising:

according to a determination of an internal setting or a determination regarding to a sensed value for an environmental light, updating or maintaining the stored value of the sensed value.

6. The proximity sensing method according to claim 1, further comprising:

determining if a sensed value for the environmental light is within a second predetermined range when the proximity sensing unit is under normal operation; and if the sensed value for an environmental light is within the second predetermined range, taking the maximum value of the sensed value for the environmental light for resetting the predetermined offset value.

7. The proximity sensing method according to claim 1, wherein the sensed value is one of the values sensed at the present or passed moment.

8. The proximity sensing method according to claim 1, wherein the predetermined offset value is the minimum value among the values sensed by the proximity sensing unit which is determined by a process unit separated from the proximity sensing unit but in the mobile device.

9. The proximity sensing method according to claim 1, further comprising:

comparing the resultant of a sensed value sensed at the present moment minus the offset value with a threshold value to determine if an object is near the mobile device.

10. A proximity sensing method applied in a proximity sensing unit in a mobile device, the method comprising:

comparing a sensed value of the proximity sensing unit with a predetermined offset value or a first predetermined range to determine if the sensed value is smaller than the predetermined offset value or if the sensed value is within the first predetermined range;

comparing the sensed value stored in the mobile device with a predetermined value; and providing an offset value for confirming if an object is near the mobile device according to the determination that if the sensed value is smaller than the predetermined offset value or within the first predetermined range;

wherein according to a variation trend of the values sensed at different timings, resetting the first predetermined range.

* * * * *